(12) United States Patent
Nairn (10) Patent No.: US 7,138,933 B2
(45) Date of Patent: Nov. 21, 2006

(54) TIME-INTERLEAVED SIGNAL CONVERTER SYSTEMS WITH REDUCED TIMING SKEWS

(75) Inventor: David Graham Nairn, Greensboro, NC (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 11/115,851

(22) Filed: Apr. 26, 2005

(65) Prior Publication Data
US 2006/0238397 A1 Oct. 26, 2006

(51) Int. Cl.
*H03M 1/00* (2006.01)
(52) U.S. Cl. .................... 341/141; 341/155
(58) Field of Classification Search .......... 341/141, 341/155, 131, 126
See application file for complete search history.

(56) References Cited

U.S. PATENT DOCUMENTS

| | | | | |
|---|---|---|---|---|
| 5,294,926 | A | | 3/1994 | Corcoran ............... 341/120 |
| 5,402,124 | A | * | 3/1995 | Todd et al. ............. 341/131 |
| 5,568,142 | A | * | 10/1996 | Velazquez et al. ....... 341/126 |
| 6,151,613 | A | * | 11/2000 | Khoini-Poorfard ....... 708/313 |
| 6,339,390 | B1 | | 1/2002 | Velazquez ............... 341/120 |
| 6,476,749 | B1 | * | 11/2002 | Yeap et al. .............. 341/155 |
| 6,476,754 | B1 | * | 11/2002 | Lowenborg et al. ...... 341/155 |
| 6,522,282 | B1 | | 2/2003 | Elbornsson ............. 341/155 |
| 6,541,952 | B1 | | 4/2003 | Nagaraj ................ 324/76.42 |
| 6,570,410 | B1 | | 5/2003 | Manganaro .............. 327/94 |
| 6,856,653 | B1 | * | 2/2005 | Taniguchi et al. ....... 375/285 |
| 7,085,232 | B1 | * | 8/2006 | Raissinia et al. ........ 370/235 |
| 2002/0075177 | A1 | * | 6/2002 | Lowemborg et al. | |
| 2002/0169603 | A1 | * | 11/2002 | Sculley | |
| 2004/0145502 | A1 | * | 7/2004 | Thompson | |

OTHER PUBLICATIONS

Tsai, Tsung-Heng, "Time-Interleaved Analog-to-Digital Converters for Digital Communications", Conference on Circuits, Signals and Systems, Nov. 2004, pp. 193-198.

Jamal, Shafiq, "A 10b 120Msample/s Time-Interleaved Analog-to-Digital Converter with Digital Background Calibration", IEEE Journal of Solid-State Circuits, vol. 37, No. 12, Dec. 2002, pp. 1618-1627.

Prenderagast, Ryan, "Reconstruction of Bandlimited Periodic Nonuniformly Sampled Signals through Multirate Filter Banks", IEEE Transactions on Circuits and Systems, Aug. 2004, pp. 1612-1622.

Jamal, Shafiq, "Calibration of Sample-Time Error in a Two-Channel Time-Interleaved Analog-to-Digital Converter", IEEE Transactions on Circuits and Systems, Jan. 2004, pp. 130-139.

(Continued)

*Primary Examiner*—Jean Bruner Jeanglaude
(74) *Attorney, Agent, or Firm*—Koppel, Patrick & Heybl (57) ABSTRACT

Time-interleaved signal converter systems are provided that multiplex respective digital sequences of system converters into an interleaved digital sequence before filtering each respective digital sequence with digital filters that apply respective filter coefficients to thereby reduce system degradation caused by converter timing skews. Use of the interleaved digital sequence in the filtering process substantially increases the system bandwidth from approximately one half of the converter sample rate $R_C$ to approximately one half of a greater system sample rate $R_S$. Converter system embodiments are preferably configured to reduce large timing skews prior to filtering the interleaved digital sequence to obtain further reduction. This combined approach has been found to enhance interleaved system performance.

20 Claims, 5 Drawing Sheets

OTHER PUBLICATIONS

Valimaki, Vesa, "Principles of Fractional Delay Filters", IEEE Conference on Acoustics, Speech and Signal Processing, ICASSP '00, Istanbul, Turkey, Jun. 5-9, 2000, pp. 1-4.

Valimaki, Vesa, et al., "Principles of Fractional Delay Filters", IEEE ICASSP, Instanbul, Turkey, Jun. 2000, pp. 2-16.

* cited by examiner

TIME-INTERLEAVED SIGNAL CONVERTER SYSTEMS WITH REDUCED TIMING SKEWS

BACKGROUND OF THE INVENTION

1. Field of the Invention

The present invention relates generally to time-interleaved signal converter systems.

2. Description of the Related Art

Analog-to-digital converters, each with a converter sample rate $R_C$, have been arranged in time-interleaved converter systems to thereby obtain a greater system sample rate $R_S$. Although time-interleaved converter systems can thus increase the speed of signal conversion, their successful realization must often resolve hardware limitations that degrade the accuracy of the system's digital output sequences.

A significant one of these limitations concerns timing skews in the samples of the analog input signal which each converter subsequently processes. These timing skews generally arise because of input signal path differences between a system input port and each converter's input sampler and/or signal path differences between the samplers and a clock generator that is clocking them.

Timing skews have been found to generate spurious tones that degrade a system's performance. The timing skews can be determined by various means such as storing known timing skews for subsequent use in the system and estimating the timing skews with various conventional algorithms. Some algorithms require the insertion of a calibration signal (e.g., a sinusoidal signal or a ramp signal) into the system input.

BRIEF SUMMARY OF THE INVENTION

The present invention is directed to signal converter systems that reduce timing skews. The novel features of the invention are set forth with particularity in the appended claims. The invention will be best understood from the following description when read in conjunction with the accompanying drawings.

DETAILED DESCRIPTION OF THE INVENTION

FIGS. 1–4B illustrate time-interleaved signal converter systems that multiplex respective digital sequences of system converters into an interleaved digital sequence before filtering each respective digital sequence with digital filters that apply respective filter coefficients to thereby reduce system degradation caused by converter timing skews. Use of the interleaved digital sequence in the filtering process substantially increases the system bandwidth from approximately one half of the converter sample rate $R_C$ to approximately one half of the greater system sample rate $R_S$.

Each respective digital sequence is thus interleaved with respective digital sequences that correspond to other converters. With respect to each converter, the other respective digital sequences contain errors because they generally only approximate the sequences which would have been obtained had the respective converter's sampler operated at exactly the system sample rate $R_S$.

Therefore, some converter system embodiments of the invention are configured to initially reduce large timing skews before subsequent filtering of the interleaved digital sequence. This combined approach has been found to further enhance the interleaved system performance.

Figure 1:
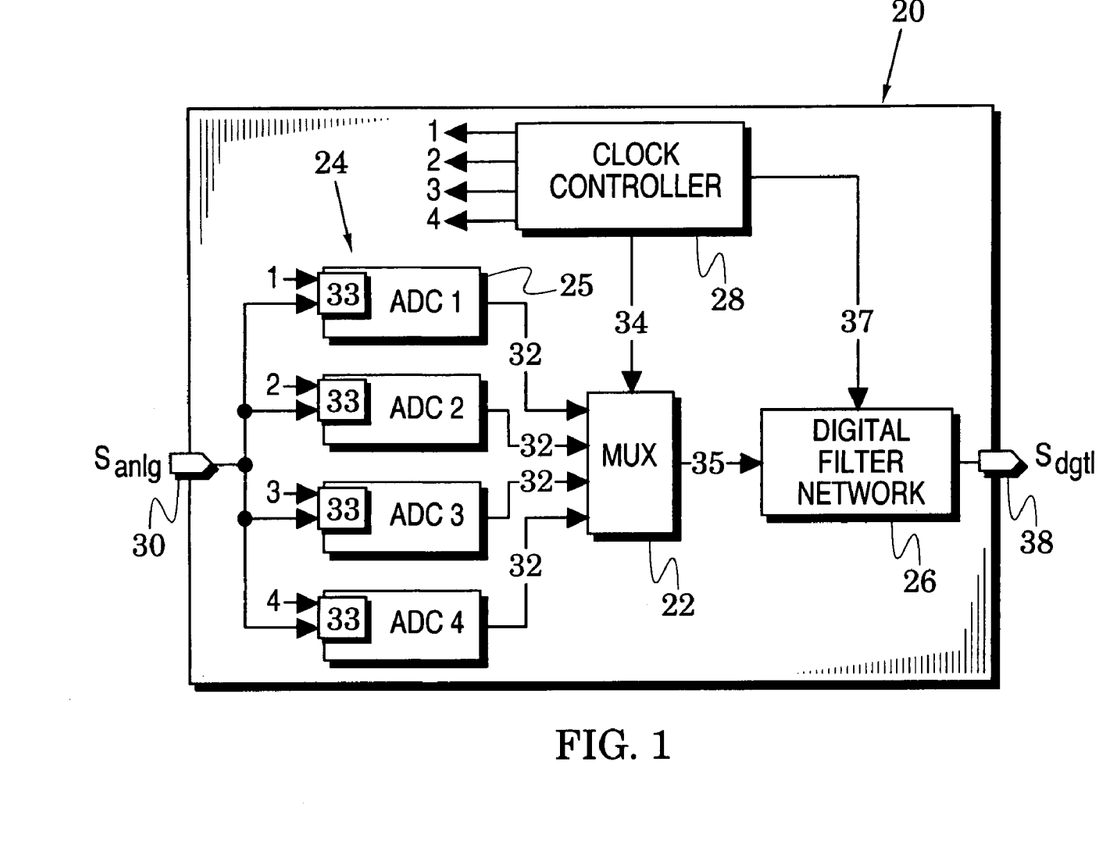
FIG. 1 is a block diagram of a time-interleaved signal converter system embodiment of the present invention.

In particular, FIG. 1 illustrates a signal converter system 20 that includes a signal multiplexer (MUX) 22 which is coupled between a group 24 of analog-to-digital converters 25 and a digital filter network 26. A clock controller 28 provides clock signals to the converters, the multiplexer and the filter network. Although the group 24 can include any number of converters, it is shown in FIG. 1, for exemplary purposes, to contain four converters.

In operation of the system 20, an analog signal $S_{anlg}$ is received at a system input port 30 and each of the converters 25 process respective samples of the analog input signal into a respective digital sequence 32 which is routed to the multiplexer 22. Each of the converters receives a respective clock signal (shown as clock signals 1 through 4) from the controller 28. The respective clock signals are interleaved so that responding samplers 33 in the converters take their respective samples of the analog input signal in a time-interleaved arrangement.

The multiplexer 32 then responds to a clock signal 34 from the controller 28 and interleaves all respective digital sequences 32 into an interleaved digital sequence 35 which is passed to the network 26. The network is configured to selectively filter at least one respective digital sequence of the interleaved digital sequence to thereby provide a corrected interleaved digital sequence $S_{dgtl}$ that reduces spurious signals originated by timing skews in the respective samples of the samplers 33. The network 26 responds to clock signals 37 from the controller 28 and the corrected interleaved digital sequence $S_{dgtl}$ is made available at a system output port 38.

The controller 28 directs the multiplexer 22 to multiplex the respective digital sequences 32 into the interleaved digital sequence 35 at a system sample rate $R_S$ whereas each of the converters 25 and its associated sampler 33 operate at a converter sample rate $R_C$ that is less than the system sample rate $R_S$. For example, the exemplary system 20 has four converters so that its system sample rate $R_S$ is four times its converter sample rate $R_C$.

To enhance conversion accuracy, it is important that the respective samples of each converter are spaced by a system period T from the samples of other converters wherein the period T is the inverse of the system sample rate $R_S$. Hardware limitations, however, will always introduce some inaccuracy in the interleaved samples that are processed by the converters 25. For example, length differences in the input signal paths between the input port 30 and the samplers 33 will introduce inaccuracies as will also length differences in the clock signal paths between the controller 28 and the samplers 33.

Figure 2A:
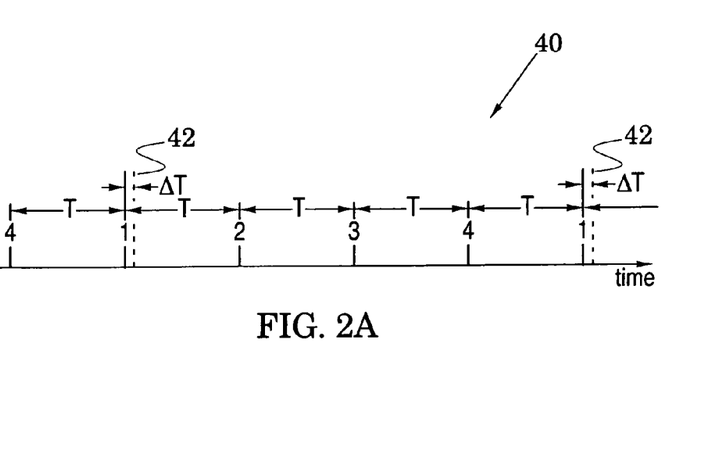
FIG. 2A is a graph that shows sample timing in converters of the system of FIG. 1.

Accordingly, the respective samples processed through each of the converters 25 may be spaced by a timing skew from their intended times. For illustration, the timing graph 40 of FIG. 2A illustrates that sample times for each converter of the system 20 should be spaced by the system period T from the samples of adjacent converters. The graph 40, however, shows an exemplary error in which respective samples of converter 1 are located at broken-line locations 42 that are spaced by a timing skew ΔT from their intended times.

Sampler timing skews will generate spurious tones in the interleaved digital sequence 35 of FIG. 1 that are input dependent. In the four-converter system shown in FIG. 1, for example, the spurious tones will be located at $R_S/2 \pm f_i$ and $R_S/4 \pm f_i$ in which $f_i$ is the frequency of the analog input signal. The resulting spurious free dynamic range (SFDR) will be degraded to $$\text{SFDR} \sim -20 \log(2\pi f_i \Delta T) \tag{1}$$

Although equation (1) is valid only when the timing skew ΔT is small compared to the system period T, this is generally the case in interleaved systems. Equation (1) points out that SFDR only depends on the timing skew ΔT and the input signal frequency $f_i$ and is not a function of the system sample rate $R_S$. When the system 20 of FIG. 1 operates at an exemplary system sample rate of 512 MHz and converters 1 and 2 have timing skews of +2 picoseconds and converters 3 and 4 have timing skews of −2 picoseconds, the system will have an SFDR on the order of 51 dB for an input signal frequency of 239.5 MHz.

The graph 40 indicates that ADC 1 has a timing skew ΔT. System embodiments of the invention are structured with the realization that the timing skew ΔT can be corrected by processing this converter's respective digital sequence 32 through a finite impulse response (FIR) filter in which the filter coefficients are determined by appropriate shifting of the filter's impulse response. The filter graphs 50 of FIG. 2B, for example, include a graph 52 of a sinc function which is the impulse response of an ideal digital lowpass filter that has a passband substantially equal to one half of the converter sample rate $R_C$.

Figure 2B:
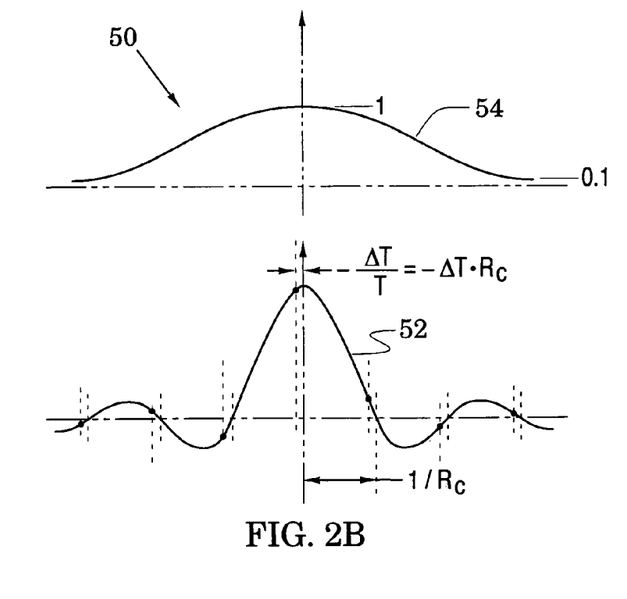
FIG. 2B is a graph of filter coefficients and an associated weighting function for a filter that could process a respective digital sequence of a converter in the system of FIG. 1.

As shown, the sinc function 52 has zero crossings spaced by the inverse of the converter sample rate $R_C$. The filter coefficients for this filter are typically defined by the peak value of the sinc function (its impulse response) and by the function value at each zero crossing of the sinc function. As indicated in FIG. 2B, these filter coefficients are preferably shifted by $-\Delta T/T$ ($-\Delta T \cdot R_C$) to locations indicated by small dots. The filter coefficients are thus shifted oppositely to the shift of the timing skew. This process is equivalent to shifting the respective analog samples of the samplers (33 in FIG. 1) to reduce their timing skews.

The sinc function 52 is preferably multiplied by a weighting function 54 which may be, for example, a Kaiser, Hanning or Hamming window. Multiplying the filter coefficients by the weighting function reduces the number of coefficients that must be processed through the FIR filter. Although this somewhat reduces the accuracy of the skew correction, it reduces the filter length to one that is more compatible with timely processing of the analog samples through the system 20 of FIG. 1. Otherwise, the filter would be excessively long and require excessive processing time.

FIR filters exemplified by the impulse response 52 and weighting function 54 of FIG. 2B are the digital versions of a continuous time delay in the analog portions of the ADCs (25 in FIG. 1) and are especially suited for inserting fractional delays in the analog signal that is represented by each respective digital sequence. The fractional delay is a small portion of each converter's time period (i.e., the inverse of the converter sample rate $R_C$). Thus, they are suited for substantially removing the small timing skews that may be generated in the samplers 33 of the converters 25, e.g., the timing skew ΔT shown in the graph 40 of FIG. 2. Realizing filters with the filter coefficients of FIG. 2B generally only requires shift, multiply and sum operations.

In accordance with Nyquist's Theorem, a converter system which operates at a system sample rate $R_S$ will unambiguously process analog input signals so long as the bandwidth of these signals is limited to less than one half the system sample rate. Embodiments of the present invention are structured with the further recognition that each of the respective digital sequences (32 in FIG. 1) operate at a lower converter sample rate $R_C$ and a digital filter that processes the respective digital sequence will have an unambiguous bandwidth that is limited to one half of that lower rate.

Directing attention again to FIG. 1, it is noted that the respective digital sequence 32 from ADC 1 lacks samples of the analog input signal $S_{anlg}$ that occur at the sample times of the other converters. It is further noted, however, that samples in the respective digital sequences of ADCs 2–4 closely approximate the missing samples in the respective digital sequence of ADC 1. In the embodiment of FIG. 1, these samples are interleaved into this ADC's respective digital sequence to form the interleaved digital sequence 35. The interleaved digital sequence 35 of FIG. 1 will support an input bandwidth that closely approaches one half the system sample rate $R_S$.

Figure 2C:
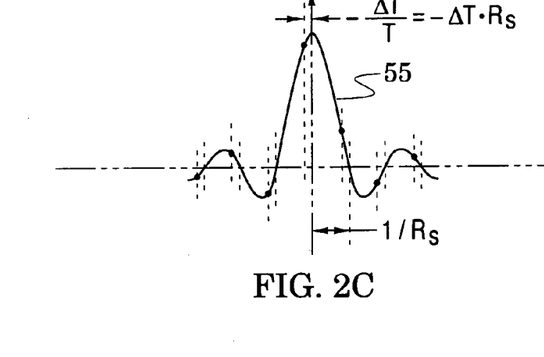
FIG. 2C is a graph of filter coefficients for a preferred filter that processes an interleaved digital sequence of a converter in the system of FIG. 1.

FIG. 2C illustrates a graph 55 of a sinc function which is the impulse response of an ideal digital lowpass filter that is suited for processing the interleaved digital sequence 35. Accordingly, this filter's passband is set substantially equal to one half of the system sample rate $R_S$ (for illustrative clarity, the horizontal scale of FIG. 2C is not reduced as much as it would be if it corresponded to the four converter system shown in FIG. 1).

The system 20 of FIG. 1 configures the digital filter network 26 in accordance with the impulse response of FIG. 2C and positions the network so that it processes the interleaved digital sequence 35. The network 26 convolves the filter coefficients found in FIG. 2C with the respective digital sequence of ADC 1 to substantially correct the timing skew of FIG. 2A. The network may also convolve the filter coefficients with the respective digital sequence of other ADCs but these processed sequences are not passed into the corrected interleaved digital sequence $S_{dgtl}$ at the output port 38.

The digital filter network 26 thus processes the greater system sample rate $R_S$ of the interleaved digital sequence 35. It is important to note that, for each of the converters 25, this sequence not only includes the respective digital sequence of that converter but also includes interleaved approximations of digital sequences that converter would have generated if it operated at the system sample rate $R_S$.

Other structural arrangements may provide a digital sequence at the system sample rate $R_S$ but fail to provide the appropriate approximations. For example, the multiplexer 22 could be replaced by a group of interpolation filters that each increase the sample rate of a respective one of the converters 25. Each interpolation filter would increase the sample rate by inserting zeros into a converter's respective digital sequence. Because these inserted zeros fail to provide the interleaved approximations, the resulting digital sequence would continue to have an unambiguous bandwidth that is limited to one half of the lower converter sample rate $R_C$.

Figure 3A:
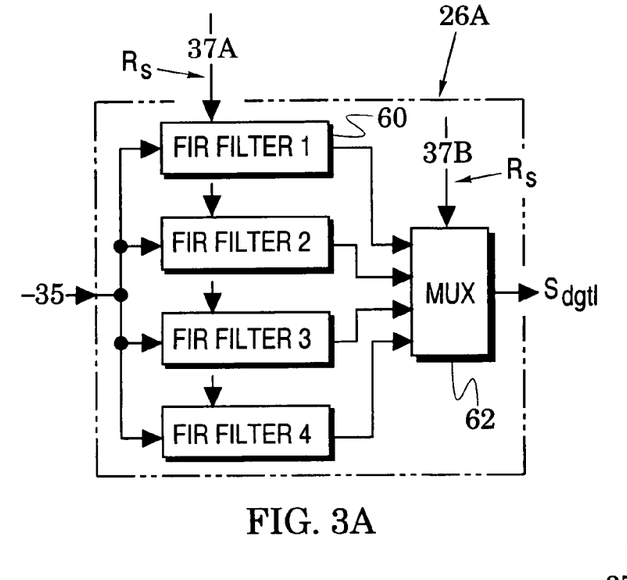
FIGS. 3A–3C are block diagrams of filter network embodiments for the system of FIG. 1.
Figure 3B:
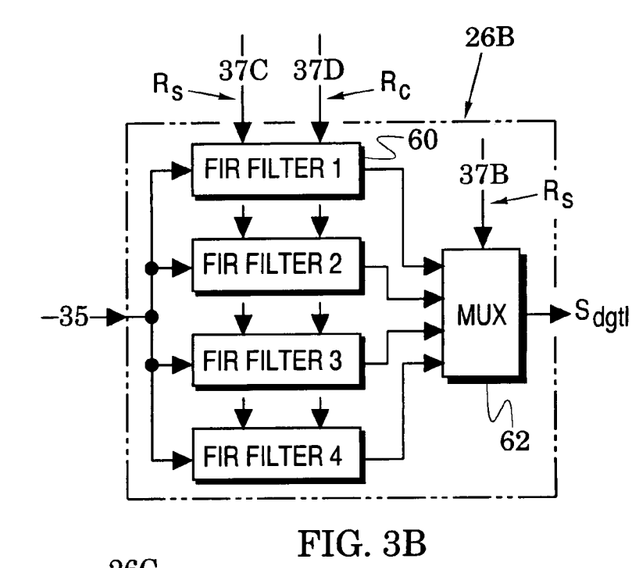
Figure 3C:
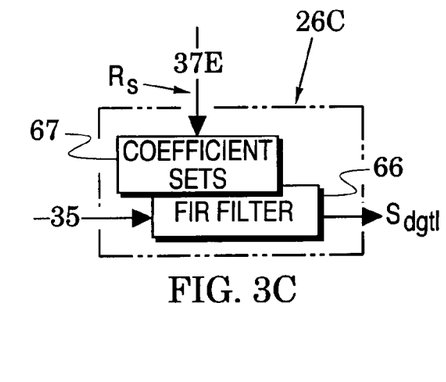

FIGS. 3A–3C illustrate some embodiments of the digital filter network 26 of FIG. 1. In the embodiment 26A of FIG. 3A, an FIR filter 60 is provided for each of the ADCs 25 of FIG. 1. Each of these FIR filters includes a set of filter coefficients that correspond to the timing skew of its respective ADC. Each filter receives the interleaved digital sequence 35 and the output sequences of these filters are multiplexed by a second multiplexer 62 to form the corrected interleaved digital sequence $S_{dgtl}$ that appears at the system output port (38 in FIG. 1).

The filter operations (e.g., shifting, multiplying and summing) of the FIR filters 60 are all conducted at the system sample rate $R_S$ in response to clock signals 37A that are provided by the controller 28 of FIG. 1. The second multiplexer 62 multiplexes the filtered digital sequences in response to clock signals 37B that are also provided by the controller (28 in FIG. 1).

With the network embodiment 26A, the controller 28 of FIG. 1 clocks the processing of respective samples through each of the converters at the converter sample rate $R_C$, clocks the generation of the interleaved digital sequence 35 by the multiplexer 22 at the system sample rate $R_S$, clocks each FIR filter 60 at the system sample rate $R_S$, and clocks generation of the corrected interleaved digital sequence $S_{dgtl}$ (at the output port 38 of FIG. 1) at the system sample rate $R_S$.

In the network 26A, therefore, the filter operations are all conducted at the system sample rate $R_S$. FIG. 3B illustrates another digital filter network 26B which includes elements of the network 26A with like elements indicated by like reference numbers. In this embodiment, it is recognized that while the shifting operations of each of the FIR filters 60 must be conducted at the system sample rate $R_S$, each filter's computational operations (e.g., multiplying and summing operations) need only be conducted at the converter sample rate $R_C$. Accordingly, the shifting operations respond to clock signals 37C that run at the system sample rate $R_S$ but the computational operations respond to clock signals 37D that run at the lesser converter sample rate $R_C$.

With the network embodiment 26B, the controller 28 of FIG. 1 clocks the processing of respective samples through each of the converters at the converter sample rate $R_C$ and clocks the generation of the interleaved digital sequence 35 by the multiplexer 22 at the system sample rate $R_S$. The controller clocks shift processes of each FIR filter 60 at the system sample rate $R_S$ but clocks multiply and sum operations of each filter at the converter sample rate $R_C$. Finally, the controller clocks generation of the corrected interleaved digital sequence $S_{dgtl}$ (at the output port 38 of FIG. 1) at the system sample rate $R_S$.

FIG. 3C illustrates another network embodiment 26C which is formed with a single FIR filter 66 and a memory 67 that includes sets 54 of filter coefficients in which each of the sets corresponds to a respective one of the signal converters 25 of FIG. 1. In operation of this network embodiment, the interleaved digital sequence 35 is shifted through the FIR filter 66 and each respective digital sequence is processed with a respective one of the sets 54. All processes of the filter proceed at the system sample rate $R_S$ in response to clock signals 37E.

With the network embodiment 26C, the controller 28 of FIG. 1 clocks the processing of respective samples through each of the converters at the converter sample rate $R_C$, clocks the generation of the interleaved digital sequence 35 by the multiplexer 22 at the system sample rate $R_S$, and clocks the selection of the sets at the system sample rate $R_S$.

Although FIGS. 3A–3C indicate various filter network embodiments formed with FIR filters, other network embodiments can be formed with other digital filter structures. For example, all-pass infinite impulse response (IIR) filters can also be used for inserting fractional delays in the analog signal that is represented by each respective digital sequence (32 in FIG. 1). The filters 60 and 66 of these figures are thus intended to represent any digital filter whose filter coefficients can be altered to effect fractional delays. Preferably, an IIR filter 66 includes registers for storing filter states that correspond to each of the sets of filter coefficients.

Figure 4A:
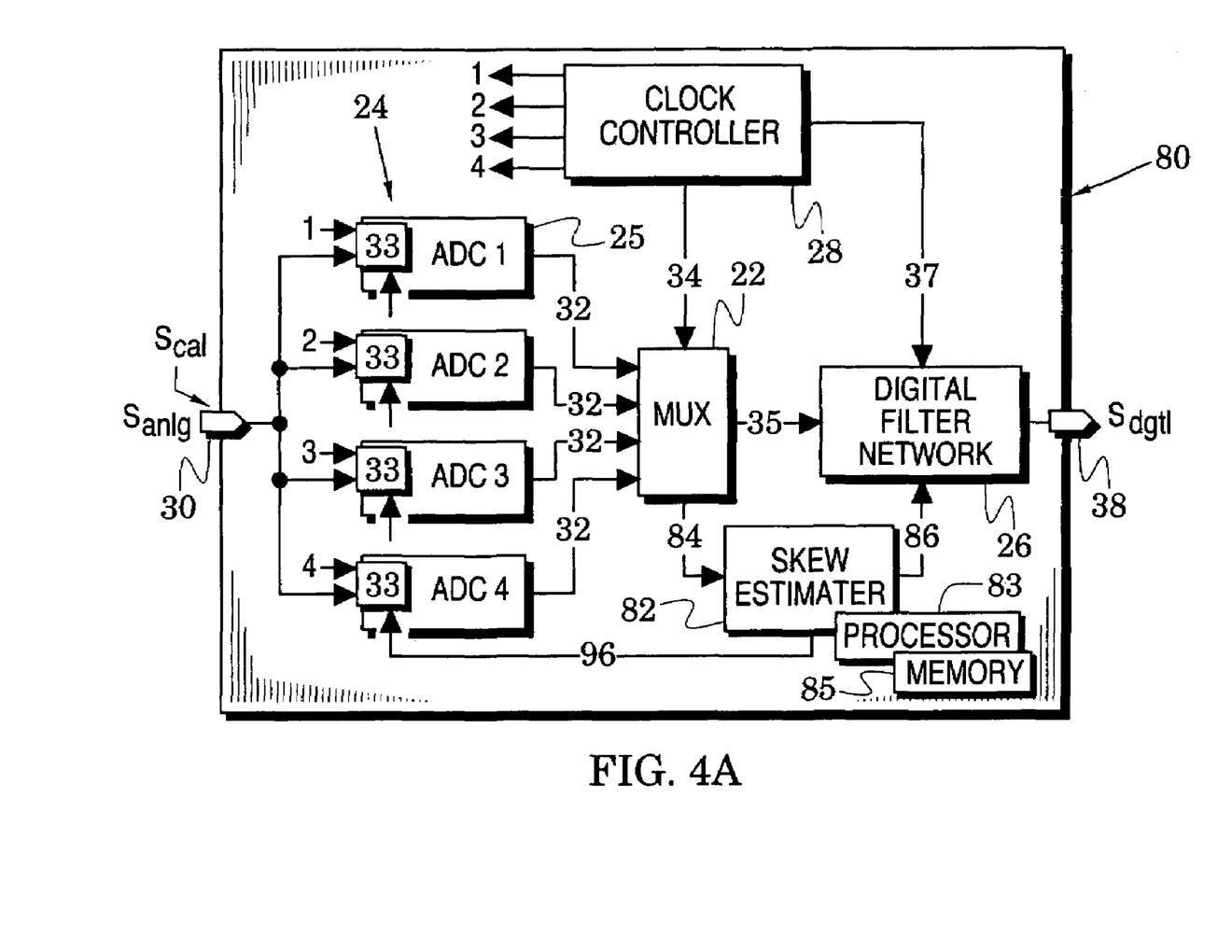
FIGS. 4A and 4B are block diagrams of other time-interleaved signal converter system embodiments.

FIG. 4A illustrates a converter system 80 which includes elements of FIG. 1 with like elements indicated by like reference numbers. In addition, the system 80 has a skew estimator 82 that is configured to estimate a timing skew $\Delta T$ in the respective samples of at least one of the converters 25. With this estimate, the estimator 82 then provides a corresponding set of filter coefficients to the network 26 in a feedforward arrangement.

In one embodiment of the skew estimator 82, either the respective digital sequences 32 at the input of the multiplexer 22 or the interleaved digital sequence 35 at the multiplexer output is provided and the estimator processes these sequences with conventional algorithms (e.g., correlation techniques and/or the discrete Fourier transform) to derive the timing skews and their associated filter coefficients. An arrow 84 in FIG. 4A runs from the multiplexer 22 to the estimator 82 to indicate the signal path for either the respective digital sequences or the interleaved digital sequence. The estimator may include a digital processor 83 for processing the algorithms. As shown in FIG. 4A, calibration signals $S_{cal}$ can be injected into the input port 30 to facilitate use of corresponding ones of the algorithms. A feedforward path 86 passes the derived filter coefficients to the network 26.

In another embodiment of the skew estimator 82, the skews have been previously estimated or are known by other means. In this embodiment, respective sets of filter coefficients have been obtained and stored in a memory 85 associated with the estimator. The estimator then provides the filter coefficients to the filter network 26 over the signal path 86.

Figure 4B:
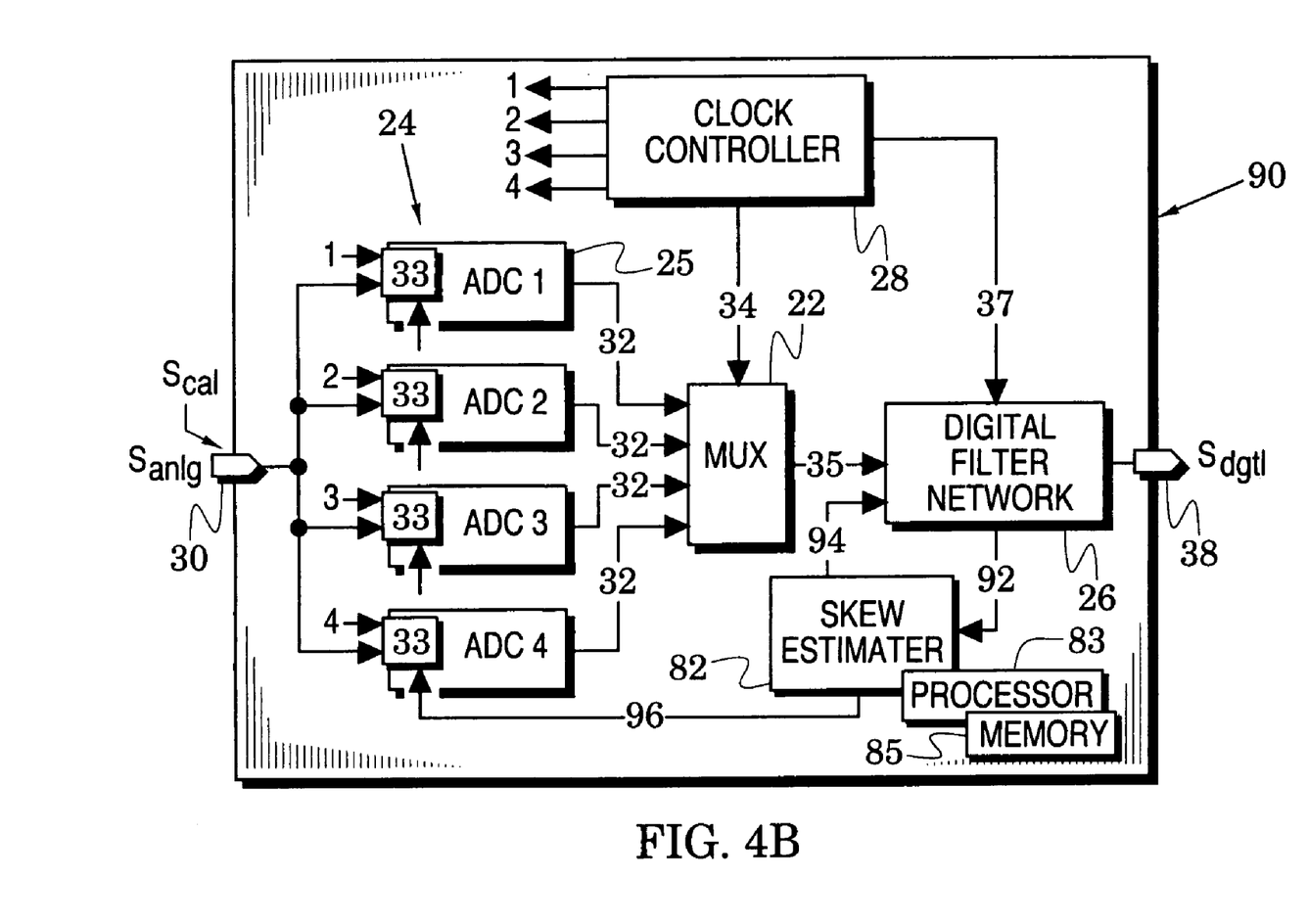

FIG. 4B illustrates a converter system 90 which includes elements of FIG. 4A with like elements indicated by like reference numbers. In contrast to the system 80 of FIG. 4A, the system 90 defines a feedback arrangement in which an arrow 92 runs to the estimator 82 to indicate a signal path from the filter network 26. This signal path may originate either from the input or the output of the second multiplexer 62 of FIGS. 3A and 3B. That is, the signal path 92 may carry either the output sequences of the FIR filters 60 or the corrected interleaved digital sequence $S_{dgtl}$.

The skew estimator then derives the timing skews and their associated filter coefficients (e.g., with algorithms as described above) and provides them over a feedback path 94 to the input of the filter network 26 (i.e., to the FIR filters 60 shown in FIGS. 3A–3C). Because the converter system 90 uses a feedback arrangement, the skew estimator 82 need only derive direction of the timing skews. In contrast to the converter system 80 of FIG. 4A, knowledge of the magnitude of the timing skews is not required because the feedback configuration will appropriately drive the converter system so as to reduce the timing skews. The feedback arrangement of FIG. 4B thus facilitates the use of simpler timing algorithms.

The feedforward and feedback arrangements shown in FIGS. 4A and 4B are configured to correct timing errors that are fractional portions of each converter's sample period (i.e., the inverse of the converter sample rate $R_C$). In network embodiments such as those of FIGS. 3A–3B, this is accomplished with fractional-delay FIR filters. As noted above, the filters process interleaved digital sequences in order to increase the system bandwidth.

Although these sequences augment each respective digital sequence, they also add system noise because they are approximations of the sequences that any converter would generate if it operated at the system sample rate $R_S$. In particular, it has been shown that the system's noise proportional to $$16 f_i R_s (\Delta T)^2 \quad (2)$$

Expression (2) indicates that interleaved converter system performance is enhanced by reducing the magnitude of the fractional delay prior to use of the fractional-delay FIR filters as described above.

In other converter embodiments, this reduction is accomplished by configuring the skew estimator 82 in FIGS. 4A and 4B to provide sample adjustment signals 96 that are fed back to each converter's sampler 33. Because of their feedback arrangement, the sample adjustment signals 96 need only indicate the direction of the sampler error. Once the sample adjustment signals have reduced sampler error well below each converter's sample period, the FIR filters (60 and 67 in FIGS. 3A–3C) can apply fractional delays as described above to further reduce converter timing skews.

Digital filter correction embodiments of the invention were applied to a simulated converter system that included five time-interleaved converters having timing skews of +10, +7, 0, −9, and −6 picoseconds. The analog input signal contained input tones at 50.5, 173.5 and 179.5 MHz and the simulation showed that the uncorrected system had a signal-to-noise-plus-distortion ratio (SNDR) of 38.7 dB. It was noted that spurious tones could be converted to broad band noise by conducting the converter sampling on a random basis. While this reduced worst case spurious signals to approximately 55 dB, the SNDR remained substantially unchanged. In contrast, the SNDR was reduced to 79 dB when filter network embodiments of the invention were realized with 21-tap FIR filters.

Converter system embodiments of the invention multiplex respective digital sequences of converters into an interleaved digital sequence before filtering with FIR filters that have filter coefficients which correspond to each of the respective digital sequences. Use of the interleaved digital sequence in the filtering process substantially increases the system bandwidth from one half of the converter sample rate $R_C$ to one half of the system sample rate $R_S$.

Each respective digital sequence is thus interleaved with respective digital sequences that correspond to other converters. As previously noted, these sequences contain errors because they generally approximate the sequences which would have been obtained had the respective converter's sampler operated at the system sample rate $R_S$. It has been shown above that this error limits the system SNR which may be obtained in a corrected interleaved system. For example, it has been found that the SNR of an interleaved system with an input signal frequency of 240 MHz and a system sample rate of 512 MHz, is limited to maximums of 86, 74 and 62 dB when its timing skews respectively increase to 5, 10 and 20 picoseconds.

As shown in equation (2), a system's SNR is proportional to the input signal frequency, proportional to the system sample rate $R_S$ and proportional to the square of the timing skew. In a correction embodiment of the invention, sampler error trimming is thus used (e.g., as indicated by sample adjustment signals 96 in FIGS. 4A and 4B) to reduce the timing skews before application of FIR filter corrections to the respective digital sequences. It has been found in a two-converter system having a sample rate of 512 MHz, that when the analog trimming reduces the timing error to approximately 10 picoseconds, application of the FIR filter corrections can obtain nearly ideal 10-bit converter performance. When the analog trimming reduces the timing error to approximately 5 picoseconds, application of the FIR filter corrections can obtain nearly ideal 12-bit converter performance.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A signal converter system, comprising:
    analog-to-digital converters that each process respective samples of an analog input signal into a respective digital sequence;
    a multiplexer that interleaves all respective digital sequences into an interleaved digital sequence; and
    a digital filter network configured to selectively filter at least one respective digital sequence of said interleaved digital sequence to thereby provide a corrected interleaved digital sequence that reduces spurious signals originated by timing skews in said respective samples.

2. The system of claim 1, wherein said network includes a digital filter which has selectable sets of filter coefficients and each respective digital sequence is processed through said network with a respective one of said sets.

3. The system of claim 2, further including a controller configured to:
    a) clock the processing of said respective samples through each of said converters at a converter sample rate;
    b) clock the generation of said interleaved digital sequence by said multiplexer at a system sample rate that exceeds said converter sample rate; and
    c) clock the selection of said sets at said system sample rate.

4. The system of claim 1, wherein said network includes:
    for at least one of said converters, a respective digital filter that receives said interleaved digital sequence and processes that converter's respective digital sequence with a respective set of filter coefficients to provide a processed respective digital sequence; and
    an output multiplexer that interleaves all processed respective digital sequences into said corrected interleaved digital sequence.

5. The system of claim 4, further including a controller configured to:
    a) clock the processing of said respective samples in each of said converters at a converter sample rate;
    b) clock the generation of said interleaved digital sequence by said multiplexer at a system sample rate that exceeds said converter sample rate;
    c) clock said respective digital filter at said system sample rate; and d) clock the generation of said corrected interleaved digital sequence by said output multiplexer at said system sample rate.

6. The system of claim 4, further including a controller configured to:
   a) clock the processing of said respective samples in each of said converters at a converter sample rate;
   b) clock the generation of said interleaved digital sequence by said multiplexer at a system sample rate that exceeds said converter sample rate;
   c) clock a shift process of said respective digital filter at said system sample rate and clock multiply and sum processes of said respective digital filter at said converter sample rate; and
   d) clock the generation of said corrected interleaved digital sequence by said output multiplexer at said system sample rate.

7. A signal converter system, comprising:
   analog-to-digital converters that each process respective samples of an analog input signal into a respective digital sequence;
   a multiplexer that interleaves all respective digital sequences into an interleaved digital sequence;
   a skew estimator configured to estimate a timing skew in the respective samples of at least one of said converters and provide a corresponding set of filter coefficients structured to reduce effects of said timing skew; and
   a digital filter network configured to selectively process at least one respective digital sequence of said interleaved digital sequence with its respective set to thereby provide a corrected interleaved digital sequence that reduces spurious signals originated by timing skews in said respective samples.

8. The system of claim 7, wherein said estimator includes a memory that stores a respective set for at least one respective digital sequence.

9. The system of claim 7, wherein said estimator includes a processor configured to determine a respective set with a stored algorithm.

10. The system of claim 7, wherein said estimator is arranged to receive said corrected interleaved digital sequence and determine a respective set for at least one respective digital sequence.

11. The system of claim 7, wherein said network includes:
    for at least one of said converters, a respective digital filter that receives said interleaved digital sequence and processes that converter's respective digital sequence with a respective set of filter coefficients to provide a processed respective digital sequence; and
    an output multiplexer that interleaves all processed respective digital sequences into said corrected interleaved digital sequence.

12. The system of claim 11, wherein said estimator is arranged to receive a processed respective digital sequence from said multiplexer and determine a respective set for the corresponding respective digital sequence.

13. The system of claim 7, wherein said estimator is arranged to receive at least one respective digital sequence and determine a respective set for that respective digital sequence.

14. The system of claim 7, wherein said estimator is arranged to receive said interleaved digital sequence from said multiplexer and determine a respective set for at least one respective digital sequence.

15. A signal converter system, comprising:
    analog-to-digital converters that each process respective samples of an analog input signal into a respective digital sequence;
    a multiplexer that interleaves all respective digital sequences into an interleaved digital sequence;
    a skew estimator configured to estimate a timing skew in the samples of at least one of said converters and provide a corresponding sample adjustment signal to that converter to reduce said timing skew and provide a corresponding set of filter coefficients structured to further reduce effects of said timing skew; and
    a digital filter network configured to selectively process at least one respective digital sequence of said interleaved digital sequence with its respective set to thereby provide a corrected interleaved digital sequence that reduces spurious signals originated by timing skews in said respective samples.

16. The system of claim 15, wherein at least one of said converters has a respective sampler that adjusts its timing in response to said corresponding sample adjustment signal.

17. The system of claim 15, wherein said network includes a digital filter which has selectable sets of filter coefficients and each respective digital sequence is processed through said network with a respective one of said sets.

18. The system of claim 15, wherein said network includes:
    for at least one of said converters, a respective digital filter that receives said interleaved digital sequence and processes that converter's respective digital sequence with a respective set of filter coefficients to provide a processed respective digital sequence; and
    an output multiplexer that interleaves all processed respective digital sequences into said corrected interleaved digital sequence.

19. The system of claim 15, wherein said estimator includes a processor configured to determine said sample adjustment signal and a respective set with at least one stored algorithm.

20. The system of claim 15, wherein said estimator includes a memory that stores said set.

* * * * *